(12) United States Patent
Choi et al.

(10) Patent No.: US 9,769,921 B2
(45) Date of Patent: Sep. 19, 2017

(54) PRINTED CIRCUIT BOARD AND MANUFACTURING METHOD THEREFOR

(71) Applicant: Tyco Electronics AMP Korea Ltd, Gyungsangbuk-do (KR)

(72) Inventors: Yang Yoon Choi, Gyunsangbuk-do (KR); Ok Ky Beak, Siheung-si (KR)

(73) Assignee: Tyco Electronics AMP Korea Ltd., Gyungsangbuk-Do (KR)

( * ) Notice: Subject to any disclaimer, the term of this patent is extended or adjusted under 35 U.S.C. 154(b) by 0 days.

(21) Appl. No.: 14/732,309

(22) Filed: Jun. 5, 2015

(65) Prior Publication Data
US 2015/0271917 A1   Sep. 24, 2015

Related U.S. Application Data

(63) Continuation of application No. PCT/KR2013/011247, filed on Dec. 6, 2013.

(30) Foreign Application Priority Data

Dec. 7, 2012   (KR) .................. 10-2012-0141576

(51) Int. Cl.
*H05K 1/02*   (2006.01)
*H05K 1/09*   (2006.01)
(Continued)

(52) U.S. Cl.
CPC ....... *H05K 1/0298* (2013.01); *C23C 18/1637* (2013.01); *C23C 18/1653* (2013.01);
(Continued)

(58) Field of Classification Search
CPC ........ H05K 1/0298; H05K 1/09; H05K 3/467; H05K 3/06; H05K 3/462; H05K 1/115; H05K 3/4602; H05K 3/429; H05K 2203/0723; H05K 2203/072; H05K 2203/073; H05K 2201/0323; H05K 3/386; H05K 2201/0154; H05K 1/021; H05K 1/0212; H05K 1/0215; H05K 1/023; H05K 1/0231; H05K 1/0233; H05K 1/0234;
(Continued)

(56) References Cited

U.S. PATENT DOCUMENTS 8,156,635 B2   4/2012   Cho et al.
2002/0127379 A1   9/2002   Suzuki et al.
(Continued)

FOREIGN PATENT DOCUMENTS

JP   8264952 A   10/1996
JP   408264952   *  10/1996
JP   2007027618 A   *  2/2007

OTHER PUBLICATIONS

Machine translation of JP2007027618A.*
(Continued)

*Primary Examiner* — Ishwarbhai B Patel
(74) *Attorney, Agent, or Firm* — Barley Snyder

(57) ABSTRACT

A printed circuit board has a double-sided substrate with an insulation layer, a bonding member, a base layer of an aluminum material, and a circuit pattern; a second insulation layer; a second bonding member; a second base layer; a through hole; a zinc substitution layer; a plating layer; and a second circuit pattern.

9 Claims, 3 Drawing Sheets

(51) Int. Cl.
*H05K 1/11* (2006.01)
*H05K 3/06* (2006.01)
*H05K 3/46* (2006.01)
*H05K 3/42* (2006.01)
*C25D 5/02* (2006.01)
*C23C 18/16* (2006.01)
*C23C 18/54* (2006.01)
*H05K 3/38* (2006.01)
*H05K 3/00* (2006.01)

(52) U.S. Cl.
CPC ............... *C23C 18/54* (2013.01); *C25D 5/02* (2013.01); *H05K 1/09* (2013.01); *H05K 1/115* (2013.01); *H05K 3/06* (2013.01); *H05K 3/429* (2013.01); *H05K 3/462* (2013.01); *H05K 3/4602* (2013.01); *H05K 3/467* (2013.01); *H05K 1/0206* (2013.01); *H05K 1/0251* (2013.01); *H05K 3/0094* (2013.01); *H05K 3/386* (2013.01); *H05K 2201/0154* (2013.01); *H05K 2201/0323* (2013.01); *H05K 2201/095* (2013.01); *H05K 2203/072* (2013.01); *H05K 2203/073* (2013.01); *H05K 2203/0723* (2013.01); *H05K 2203/1476* (2013.01)

(58) Field of Classification Search
CPC ...... H05K 1/0243; H05K 1/0295; H05K 1/14; H05K 1/141; H05K 1/142; H05K 1/16; H05K 1/162; H05K 1/165; H05K 1/167; H05K 1/18; H05K 1/181; H05K 1/182; H05K 1/183; H05K 1/184; H05K 1/185; H05K 2201/0317; H05K 2201/041; H05K 2201/049; H05K 2201/09763; H05K 2201/09872; H05K 2201/10446; H05K 2201/10462; H05K 2201/10469; H05K 2201/10477; H05K 2201/10484; H05K 2201/10492; H05K 2201/105; H05K 2201/10674; H05K 3/30; H05K 3/32; H05K 3/341; H05K 3/3415; H05K 3/3421; H05K 3/3431; H05K 3/36; H05K 3/46; C23C 18/1637; C23C 18/54; C23C 18/1653; C25D 5/02

See application file for complete search history.

(56) References Cited

U.S. PATENT DOCUMENTS

| | | | | |
|---|---|---|---|---|
| 2005/0178669 | A1* | 8/2005 | Strubbe | C23C 18/1653 205/185 |
| 2009/0133920 | A1* | 5/2009 | Kim | H05K 3/429 174/266 |
| 2009/0277679 | A1* | 11/2009 | Jung | H05K 3/429 174/266 |
| 2012/0111622 | A1 | 5/2012 | Daigaku et al. | |

OTHER PUBLICATIONS

International Search Report, International Application No. PCT/KR2013/011247, dated Mar. 13, 2014, 2 pages.
Supplementary European Search Report, dated Jul. 14, 2016, 9 pages.
Abstract of JPH08264952, dated Oct. 11, 1996, 2 pages.

* cited by examiner

PRINTED CIRCUIT BOARD AND MANUFACTURING METHOD THEREFOR

CROSS-REFERENCE TO RELATED APPLICATION

This application is a continuation of International Patent Application No. PCT/KR2013/011247, filed Dec. 6, 2013, which claims priority under 35 U.S.C. §119 to Korean Patent Application No. 10-2012-0141576 filed on Dec. 7, 2012.

FIELD OF THE INVENTION

The invention is generally related to a printed circuit board, and, more specifically, to a printed circuit board having increased heat dissipation and bending strength.

BACKGROUND

In general, a printed circuit board (PCB) is a component in which electric wirings are integrated to allow various devices to be populated therein or to be electrically connected to one another. Technological developments have led to an increase in production of PCBs having various forms and functions. Demand for such PCBs has been increasing with a growth of industries using the PCBs and relating to, for example, home appliances, communication devices, semiconductor equipment, industrial machinery, and electrical control of vehicles. In addition, PCB products are being transformed into a miniaturized, light-weight, and high value-added products, as electronic components become smaller and more sophisticated. As electronic components become increasingly more sophisticated and perform more complex functions, they consume increasing amounts of power, and, as a result, correspondingly generate greater amounts of heat. The levels of generated heat are such that they are becoming a factor used by consumers to evaluate a degree of satisfaction with the electronic product, and affect consumer purchasing habits.

Conventionally, a multilayer PCB is manufactured by using a copper-clad laminate (CCL) as a base substrate, forming a circuit pattern on the CCL, and laminating a layer. The use of copper (Cu) as a material for the base substrate which providing excellent conductivity, also limits the ability to improve heat dissipation characteristics of the PCB. When multilayer PCBs are required in an application, the conventional method of manufacturing with copper (Cu) becomes limiting, because of the resulting heat generated by the multilayer PCB.

Recently, developments have been made to manufacture PCBs using aluminum (Al) rather than copper (Cu), because aluminum (Al) has a more desirable thermal conductivity than copper (Cu).

Korean Patent Application No. 10-0674321 discloses an example of a PCB having aluminum as a base substrate. The PCB includes an aluminum core, a circuit pattern formed therein, a central layer having an etching resist pattern formed on opposite surfaces thereof, an insulation layer on opposite surfaces of the central layer, an additional circuit layer on the insulation layer and having a circuit pattern formed thereon, a through-hole penetrating the aluminum core, the insulation layer, and the additional circuit layer, and a zinc plating layer on an inner wall of the through hole, and a copper plating layer on the substrate that electrically connects the layers together.

Japanese Patent Publication No. 2004-179291 discloses a method of substituting aluminum for an insulation layer and forming a circuit on opposite surface to improve a bending reinforcing performance. The method includes preparing a desired surface roughness on a non-conducting material using through-hole treatment, closely contacting anodized aluminum to a plating layer in the through-hole, and forming a circuit on both aluminum faces. In addition, a desirable anodizing depth is disclosed having a range of 10 to 100 micrometers (μm), where no electrical shock occurs, and a desirable insulating function is achieved in an anodizing depth of 30 μm.

One of the disadvantages to the conventional methods of manufacturing a printed circuit board (PCB) using an aluminum core is that a surface of the aluminum core may be corroded during electroless copper plating. This is because an aluminum material included in the aluminum core of the PCB has a lower chemical resistance compared to conventionally used copper. In such a case, a copper film formed during the electroless copper plating may not be in a complete contact with a lower portion of the aluminum core, and a surface of the copper film is lifted, resulting in poor adhesion to the aluminum core after electrolytic copper plating has been performed. Thus, reliability of the resulting product decreases.

When used for office automation equipment, portable terminals, and the like having a relatively stable temperature range for application, the PCB manufactured using such a conventional technology may have a stable adhesion to the copper film due to the anodizing performed on the aluminum core. However, when applied to applications such as electronic controls for a vehicle or an engine room, the PCB suffers from decreasing adhesion between a thin aluminum film and the copper film due to the harsh environment.

In addition, when being applied to a vehicle, the PCB may have an issue in that the PCB may be damaged by a difference in a thermal expansion coefficient between the aluminum core and subsequent layers disposed on the aluminum core, due to high temperature typically found in such applications.

Further, the method of layering an insulator on both sides of a semi-processed aluminum substrate disclosed in Korean Patent Application No. 10-0674321 has other disadvantages. For example, the aluminum substrate is connected to subsequent layers due to a circuit etching process and thus, an independent portion or circuit may not be formed. In addition, an entire layer is limited to a certain electrode, (+) or (−), when applying an electric current. Thus, a great number of process steps are required to manufacture a multilayer PCB, and it is difficult to integrate the circuit and simplify the product.

SUMMARY

A printed circuit board has a double-sided substrate with an insulation layer, a bonding member, a base layer of an aluminum material, and a circuit pattern; a second insulation layer; a second bonding member; a second base layer; a through hole; a zinc substitution layer; a plating layer; and a second circuit pattern.

BRIEF DESCRIPTION OF THE DRAWINGS

The invention will now be described by way of example, with reference to the accompanying Figures, of which.

DETAILED DESCRIPTION OF THE EMBODIMENT(S)

Figure 1:
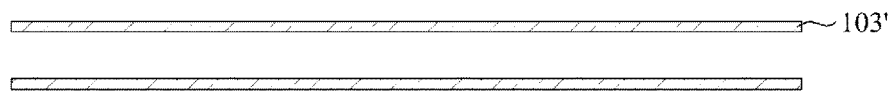
FIG. 1 is a cross-sectional view of a printed circuit board after a first manufacturing step.

Reference will now be made in detail to embodiments of the invention, of which are illustrated in the accompanying drawings, wherein like reference numerals refer to like elements throughout. The embodiments are described below in order to explain the invention by referring to the figures. In descriptions of the exemplary embodiments provided herein, known functions or configurations may be omitted to for purposes of clarity or brevity.

Hereinafter, a method of manufacturing a printed circuit board (PCB) will be described in detail with reference to FIGS. 1-6. Unless indicated otherwise, a phrase "on a layer" refers to "on both an upper surface and an opposite lower surface of the layer."

In an embodiment shown in FIG. 1, a base layer 103' is an aluminum foil having a predetermined thickness. To improve a bonding performance of the base layer 103', soft etching is performed on a surface of the base layer 103' using a sulfuric acid type, or oxidation treatment is performed to form a surface roughness on the surface of the base layer 103'.

Figure 2:
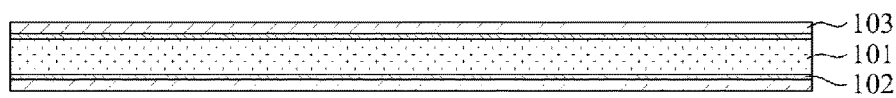
FIG. 2 is a cross-sectional view of the printed circuit board after a second manufacturing step.

In an embodiment shown in FIG. 2, a base layer 103 having the surface roughness, is bonded onto both an upper surface and an opposite lower surface of an insulation layer 101 using a bonding member 102 therebetween. The insulation layer 101 is made of a known insulating material. The bonding member 102 is a polyimide-based insulating bonding sheet, which has a desirable bonding performance and insulating function, or an epoxy, such as glass epoxy resin. Additionally, in an embodiment, a material having a thermal expansion coefficient similar to a thermal expansion coefficient of the base layer 103 is used for the bonding member 102. Here, since polyimide is stable at a high temperature of 400° C. or higher, or at a low temperature of −269° C., the polyimide may absorb a thermal energy based on a thermal expansion coefficient of aluminum, for example, 23.03×10−6° C. To bond the base layer 103 onto the insulation layer 101, a predetermined temperature and pressure may be applied to the base layer 103.

Figure 3:
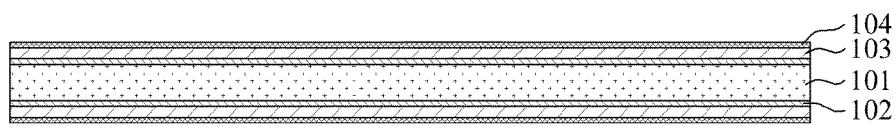
FIG. 3 is a cross-sectional view of the printed circuit board after a third manufacturing step.

In an embodiment shown in FIG. 3, a dry film 104 is applied onto the base layer 103.

Figure 4:
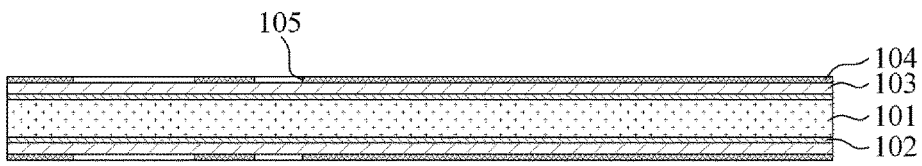
FIG. 4 is a cross-sectional view of the printed circuit board after a fourth manufacturing step.

In an embodiment shown in FIG. 4, a pattern 105 is created through light exposure and development of portions of the dry film 104 for a predetermined amount of time.

Figure 5:
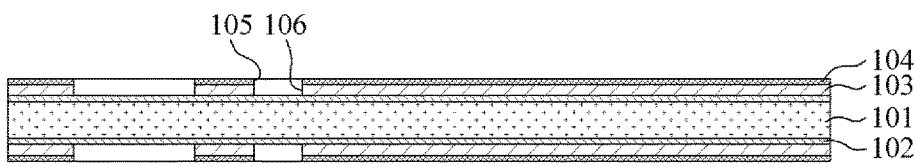
FIG. 5 is a cross-sectional view of the printed circuit board after a fifth manufacturing step.

In an embodiment shown in FIG. 5, a circuit pattern 106 is formed by removing the base layer 103 based on the pattern 105 of the dry film 104.

Figure 6:
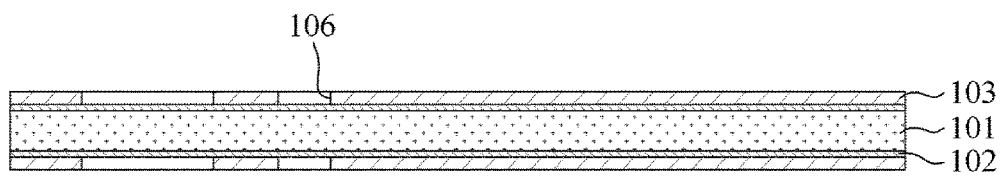
FIG. 6 is a cross-sectional view of the printed circuit board after a sixth manufacturing step.

In an embodiment shown in FIG. 6, the final single layered PCB is completed by removing the dry film 104 from the base layer 103 on which the circuit pattern 106 is formed. The circuit pattern 106 is formed by selectively removing a portion of the base layer 103 exposed by the pattern 105 using hydrochloric acid-based acidic etching in a state in which the dry film 104 is connected to the base layer 103. In an embodiment, the hydrochloric acid type is ferric chloride, cupric chloride, or sodium chlorate.

Although forming the circuit pattern 106 directly on the base layer 103 is described as in the exemplary embodiments, the invention is not limited thereto. Those of ordinary skill in the art would appreciate that in another embodiment, the circuit pattern 106 is positioned on a plating layer after the plating layer is formed on the base layer 103 using electrolytic or electroless plating.

Additionally, while a chemical method is described in the exemplary embodiments to form the circuit pattern 106, the invention is not to be limited thereto. Those of ordinary skill in the art would appreciate that in other embodiments, a mechanical method using punching and the like may be used to form the circuit pattern 106, or that only a through hole may be formed to connect an electrode or a metal layer in lieu of the circuit pattern 106.

Hereinafter, a method of manufacturing a multilayer PCB will be described in detail with reference to FIGS. 7-12, using the PCB manufactured in accordance with the method described with reference to FIGS. 1-6. Hereinafter, for ease of description, the PCB manufactured in accordance with the method described with reference to FIGS. 1 through 6 will be referred to as a double-sided substrate.

Figure 7:
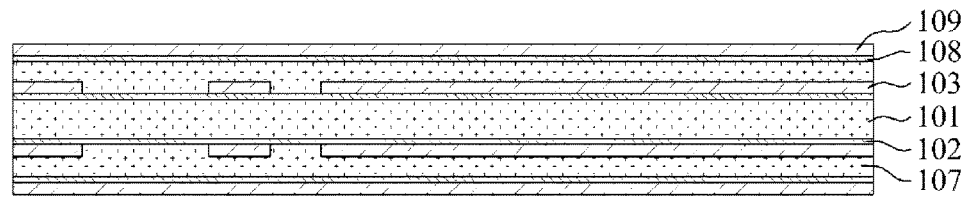
FIG. 7 is a cross-sectional view of a multilayered printed circuit board after a first manufacturing step.

In an embodiment shown in FIG. 7, an insulation layer 107 having a predetermined thickness fills the circuit pattern 106 in the double-sided substrate manufactured in accordance with the method described in the embodiments of FIGS. 1-6. A base layer 109 is bonded onto the insulation layer 107 using a bonding member 108. In an embodiment, the base layer 109 is an aluminum foil having a predetermined thickness, and polyimide-based insulating bonding sheet or an epoxy is used for the bonding member 108.

Figure 8:
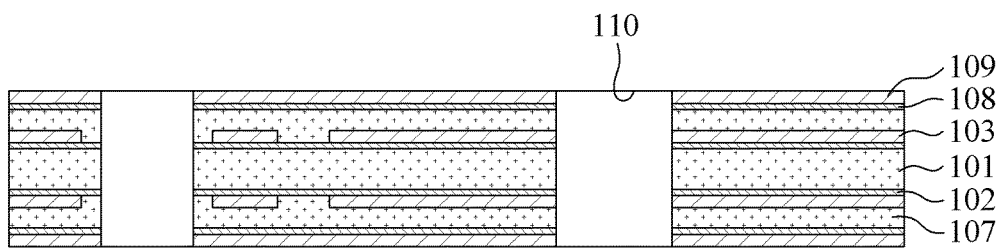
FIG. 8 is a cross-sectional view of the multilayered printed circuit board after a second manufacturing step.

In an embodiment shown in FIG. 8, a through hole 110 is formed to penetrate and extend through the double-sided substrate, the insulation layer 107, the bonding member 108, and the base layer 109. The through hole 110 is formed by drilling or laser processing.

Figure 9:
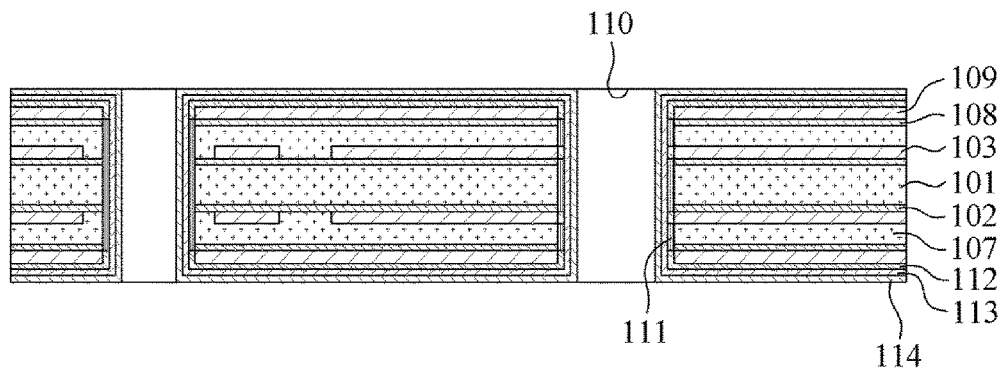
FIG. 9 is a cross-sectional view of the multilayered printed circuit board after a third manufacturing step.

In an embodiment shown in FIG. 9, after the through hole 110 is formed, a metal layer 111 is formed to metalize a cross-sectional portion of the insulation layers 101 and 107 and the bonding members 102 and 108 exposed on an inner surface of the through hole 110. In an embodiment, the metal layer 111 is a carbon plating layer deposited using carbon direct plating. Upon formation of the metal layer 111, the base layers 103 and 109 are electrically connected.

Subsequently, a substitution layer 112 having a predetermined thickness is positioned on a surface of the base layer 109 where there is no metal layer 111. The substitution layer is deposited on the base layer 109 by performing zincate treatment on a surface of the base layer 109. The substitution layer 112 is a portion of the surface of the base layer 109 being substituted by a zinc film. The thickness of the substitution layer 112 is equal to a thickness of the metal layer 111, based on the overall thickness of the metal layer 111. The substitution layer 112 has the thickness on a remaining surface of the base layer 109 from which the metal layer 111 is excluded. Once the substitution layer 112 has been deposited, aluminum may be prevented from being oxidized in an atmosphere, and thus, the surface of the base layer 109 may be protected. Further, with the surface of the base layer 109 being substituted by the zinc film, the surface of the base layer 109 may be prevented from being corroded during electrolytic and electroless plating to be subsequently performed.

A substitution plating layer 113 is formed on the substitution layer 112 using the electrolytic or the electroless plating. Here, the substitution plating layer 113 is deposited on the substitution layer 112 by performing displacement plating using a metal film having a strong chemical resistance. In an embodiment, the substitution plating layer 113 is formed by performing displacement plating using nickel (Ni), and substituting a nickel film for the substitution layer 112. However, the displacement plating is not limited to using nickel. In other embodiments, other metals having a strong chemical resistance, such as gold (Au) or silver (Ag), are used for the displacement plating.

Those of ordinary skill in the art would appreciate that while a partial thickness of the substitution layer 112 is substituted by the nickel film through the nickel displacement plating in the described embodiments, the invention is not limited thereto. Instead, in other embodiments, both the metal layer 111 and the substitution layer 112 are substituted for the substitution plating layer 113. Additionally, in an embodiment, the substitution plating layer 113 is positioned only on the substitution layer 112 apart from the metal layer 111, or is positioned to cover a portion or an entirety of the metal layer 111.

An electrolytic plating layer 114 is positioned on the substitution plating layer 113. The electrolytic plating layer 114 is also positioned on the substitution plating layer 113 in the through hole 110. In an embodiment, the electrolytic plating layer 114 is a copper film deposited through copper plating using electrolytic plating methods. In an embodiment, electrolytic plating layer 114 has a thickness of greater than or equal to 20 micrometers ($\mu$m), although those of ordinary skill in the art would appreciate that other thicknesses may also be used.

At least one of the substitution plating layer 113 and the electrolytic plating layer 114 is positioned on the surface of the metal layer 111. When the substitution plating layer 113 is only on a portion of the substitution layer 112 positioned away from the metal layer 111, the electrolytic plating layer 114 cover all the substitution plating layer 113 and the metal layer 111, and only the electrolytic plating layer 114 is positioned on the metal layer 111. When the substitution plating layer 113 only covers a portion of the metal layer 111, the electrolytic plating layer 114 covers all the substitution plating layer 113 and the metal layer 111. When the substitution plating layer 113 fully covers the metal layer 111, the electrolytic plating layer 114 covers the substitution plating layer 113, and thus, two layers, the substitution plating layer 113 and the electrolytic plating layer 114, are positioned on the metal layer 111.

Figure 10:
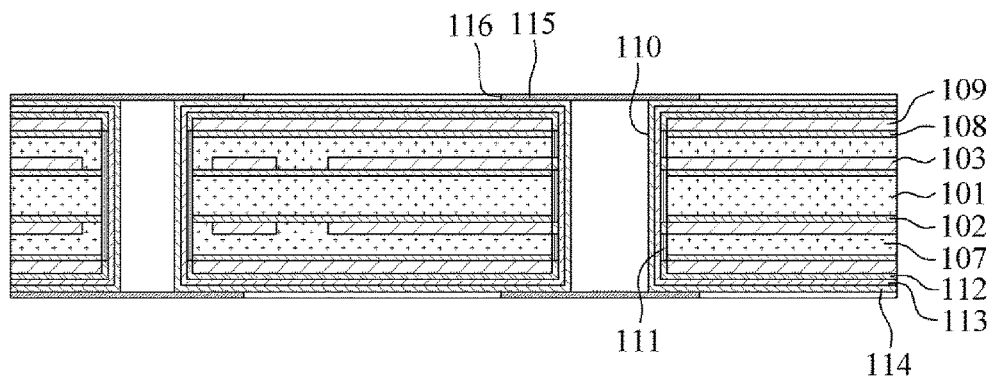
FIG. 10 is a cross-sectional view of the multilayered printed circuit board after a fourth manufacturing step.

In an embodiment shown in FIG. 10, a circuit trace pattern 116 is formed by applying a dry film 115 on the electrolytic plating layer 114 and performing light exposure and development for a predetermined amount of time.

Figure 11:
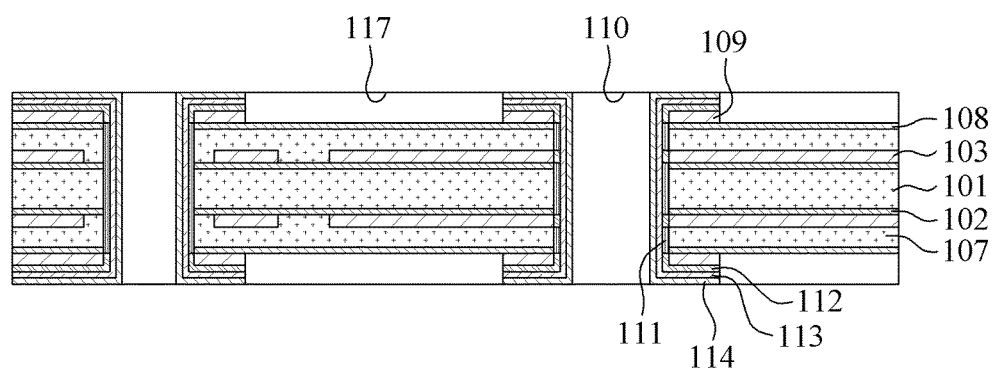
FIG. 11 is a cross-sectional view of the multilayered printed circuit board after a fifth manufacturing step.
Figure 12:
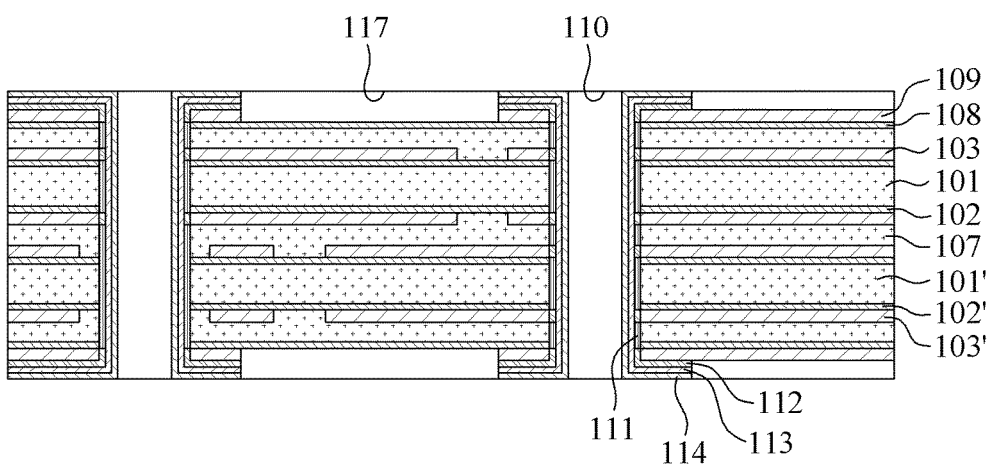
FIG. 12 is a cross-sectional view of the multilayered printed circuit board after a sixth manufacturing step.

In the embodiments shown in FIGS. 11 and 12, a circuit pattern 117 is formed by removing the electrolytic plating layer 114, the substitution plating layer 113, the substitution layer 112, and the base layer 109 using the dry film 115 on which the circuit trace pattern 116 is formed. The circuit pattern 117 is formed by removing the electrolytic plating layer 114, the substitution plating layer 113, the substitution layer 112, and up to the base layer 109 through hydrochloric acid-based acidic etching from areas where the dry film 115 is not present. The method of forming the circuit pattern 117 by applying the dry film 115 and forming the circuit trace pattern 116 is substantially similar to the above described method shown in the embodiments of FIGS. 1-6. Thus, repeated descriptions are omitted here for purposes of brevity.

Although embodiments described in the foregoing relate to forming a double-layer double-sided substrate, the invention not limited thereto. A multilayer PCB, such as a three, four, or more layered substrate, can be formed by repetitively performing operations described with reference to FIGS. 7-11. In an embodiment, a higher multiple layered PCB is formed by layering at least three double-sided substrates through operations to be described with reference to FIG. 12.

As shown in the embodiment of FIG. 12, a multilayer PCB is prepared by layering at least two double-sided substrates manufactured through the method described with reference to FIGS. 1-6. An insulation layer 107 is interposed between the double-sided substrates to be layered, to electrically separate each of the double-sided substrates from each other. When the double-sided substrates are layered, the insulation layer 107, a bonding member 108, and a base layer 109 are each on each of an uppermost surface and a lowermost surface of the double-sided substrates.

By applying the method described with reference to FIGS. 7-11, a through hole 110 is formed, and then the metal layer 111, the substitution layer 112, the substitution plating layer 113, and the electrolytic plating layer 114 are sequentially formed. Subsequently, a multilayered substrate, which is the multilayer PCB, is formed having the circuit pattern 117 using the dry film 115.

The circuit pattern 117 is formed through a chemical method using the hydrochloric acid-based acidic etching using the dry film 115. The chemical method may be used to form the circuit pattern 117 by selectively removing a layer, such as removing up to the second base layer 109, in addition to the electrolytic plating layer 114, the substitution plating layer 113, and the substitution layer 112.

In addition to the chemical method using a dry film and hydrochloric acid-based acidic etching, in an embodiment, a mechanical method using punching and the like can be used to form a circuit trace pattern on a base layer to be layered in the multilayer substrate. Further, in an embodiment, only a through hole is formed to connect an electrode or a metal layer in a predetermined form.

The above described methods offer a number of advantages over the conventional aluminum-based PCB's. For example, by using a polyimide bonding sheet having a similar thermal expansion coefficient to that of aluminum, damage to a substrate is prevented despite a severe condition of a drastic change in vibration and temperature. Thus the reliability of a product can be improved.

Additionally, by formation of surface roughness on a base layer, reduction in the amount of time for manufacturing the PCB, and reduction in the manufacturing cost can be significantly reduced, because the PCB can be manufactured using relatively inexpensive aluminum rather than expensive copper.

The manufacturing cost is further reduced by applying existing layering, plating, and circuit forming methods, and the resulting PCB is superior to the conventional aluminum-based PCBs because the resulting PCB has improved current carrying, heat dissipation, and bending strength.

While this disclosure includes specific embodiments, those of ordinary skill in the art would appreciate that various changes in form and details may be made to these examples without departing from the spirit and scope of the claims and their equivalents. The examples described herein are to be considered exemplary only, and not limiting. Descriptions of features or aspects in each embodiment are to be considered as being applicable to similar features or aspects in other embodiments. Suitable results may be achieved if the described techniques are performed in a different order, and/or if components in a described system, architecture, device, or circuit are combined in a different manner and/or replaced or supplemented by other components or their equivalents.

Therefore, the scope of the invention is defined not by the detailed description, but by the claims and their equivalents, and all variations within the scope of the claims and their equivalents are to be construed as being included in the disclosure.

What is claimed is:

1. A printed circuit board, comprising:
   a double-sided substrate having:
     an insulation layer,
     a bonding member on opposite sides of the insulation layer,
     a base layer of an aluminum material bonded to the opposite sides of the insulation layer through the bonding member, and
     a circuit pattern on a surface of the base layer;
   a second insulation layer on the base layer;
   a second bonding member on the second insulation layer;
   a second base layer bonded to the second insulation layer through the second bonding member;
   a through hole extending through the double-sided substrate, the second insulation layer, and the second base layer;
   a metal layer positioned on portions of the insulation layer, the bonding member, the second insulation layer, and the second bonding member that are exposed on an inner surface of the through hole;
   a zinc substitution layer on an outer surface of the second base layer and a portion of the second base layer exposed on the inner surface of the through hole on which the metal layer is not positioned;
   a plating layer on the zinc substitution layer and the metal layer; and
   a second circuit pattern on the plating layer.

2. The printed circuit board of claim 1, wherein the zinc substitution layer has a thickness equal to a thickness of the metal layer.

3. The printed circuit board of claim 2, wherein the plating layer is an electrolytic or electroless deposited plating layer.

4. The printed circuit board of claim 3, wherein the plating layer includes:
   a substitution plating layer deposited on a surface of the substitution layer; and
   an electrolytic plating layer of a cupric material deposited on the substitution plating layer.

5. The printed circuit board of claim 4, wherein the substitution plating layer fully covers the metal layer, and the electrolytic plating layer fully covers the substitution plating layer.

6. The printed circuit board of claim 4, wherein the substitution plating layer is on a portion of the substitution layer positioned apart from the metal layer, or is on the substitution layer and a portion of the metal layer; and
   the electrolytic plating layer covers a portion of the metal layer positioned apart from the substitution plating layer.

7. The printed circuit board of claim 1, wherein at least one or at least two double-sided substrates are layered.

8. The printed circuit board of claim 7, wherein at least two double-sided substrates are layered and an insulation layer is positioned between each double-sided substrate.

9. The printed circuit board of claim 1, wherein the aluminum base layer has a surface roughness.

* * * * *